US012650481B2

(12) United States Patent
De Zanche et al.

(10) Patent No.: US 12,650,481 B2
(45) Date of Patent: Jun. 9, 2026

(54) RADIO FREQUENCY COIL ARRAY FOR USE IN A COMBINED LINEAR ACCELERATOR AND MAGNETIC RESONANCE IMAGING SYSTEM (LINAC-MR/MR-LINAC) AND A LINAC-MR/MR-LINAC INCORPORATING THE SAME

(71) Applicant: Alberta Health Services, Edmonton (CA)

(72) Inventors: Nicola De Zanche, Edmonton (CA); Radim Barta, Edmonton (CA); B. Gino Fallone, Edmonton (CA)

(73) Assignee: ALBERTA HEALTH SERVICES, Edmonton (CA)

( * ) Notice: Subject to any disclaimer, the term of this patent is extended or adjusted under 35 U.S.C. 154(b) by 121 days.

(21) Appl. No.: 18/654,569

(22) Filed: May 3, 2024

(65) Prior Publication Data

US 2024/0369658 A1     Nov. 7, 2024

Related U.S. Application Data

(60) Provisional application No. 63/500,497, filed on May 5, 2023.

(51) Int. Cl.
| | | |
|---|---|---|
| *G01R 33/36* | (2006.01) | |
| *G01R 33/34* | (2006.01) | |
| *G01R 33/44* | (2006.01) | |

(52) U.S. Cl.
CPC ..... *G01R 33/365* (2013.01); *G01R 33/34007* (2013.01); *G01R 33/445* (2013.01)

(58) Field of Classification Search
CPC ............ G01R 33/365; G01R 33/34007; G01R 33/445
See application file for complete search history.

(56) References Cited

U.S. PATENT DOCUMENTS

2003/0060699 A1 *   3/2003   Creemers ........... G01R 33/3415
600/410

* cited by examiner

*Primary Examiner* — G.M. A Hyder
(74) *Attorney, Agent, or Firm* — Tarolli, Sundheim, Covell & Tummino LLP

(57) ABSTRACT

A radio frequency (RF) coil array for use with a magnetic resonance system having a rotating main magnetic field $B_0$ comprises at least three separate coils, the coils being electrically isolated from one another, concentrically overlaid to form a stack, and configured to sense magnetization precession in three orthogonal planes.

20 Claims, 10 Drawing Sheets

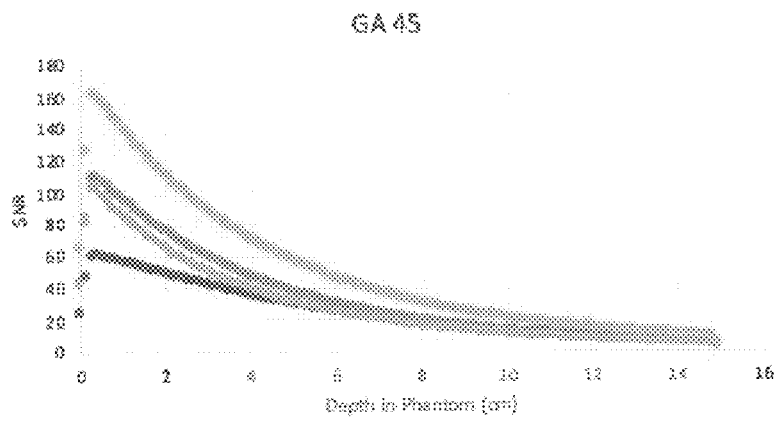
Figure 9e
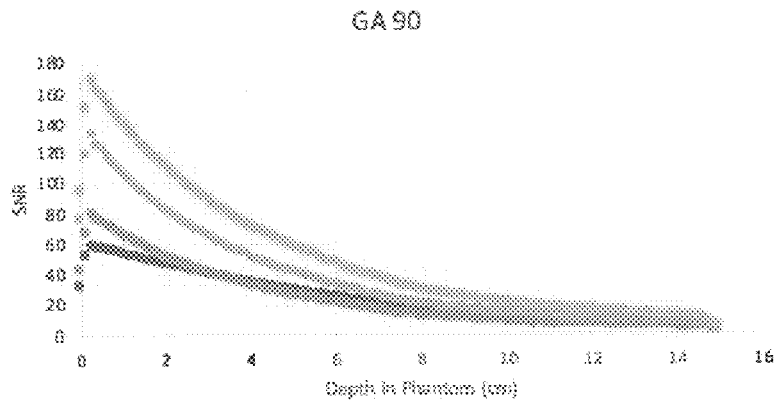
Figure 9f
Figure 9g

RADIO FREQUENCY COIL ARRAY FOR USE IN A COMBINED LINEAR ACCELERATOR AND MAGNETIC RESONANCE IMAGING SYSTEM (LINAC-MR/MR-LINAC) AND A LINAC-MR/MR-LINAC INCORPORATING THE SAME

CROSS-REFERENCE TO RELATED APPLICATION

This application claims priority to U.S. Provisional Application No. 63/500,497 filed on May 5, 2023 for an invention entitled "Radio Frequency Coil Array For Use In A Combined Linear Accelerator And Magnetic Resonance Imaging System (Linac-MR) And A Linac-MR Incorporating The Same", the entire content of which is incorporated herein by reference.

FIELD

The subject disclosure relates to a radio frequency (RF) coil array for use in a combined linear accelerator and magnetic resonance imaging system (Linac-MR or MR-linac hereinafter referred to as Linac-MR) and a Linac-MR incorporating the same.

BACKGROUND

Radiation therapy can be given to treat proliferative tissue disorders including but not limited to cancer, arteriovenous malformations, dermatological lesions, etc. During external beam radiation therapy, the tissue of the patient known to or suspected to contain the disease is exposed to radiation. Linear accelerators are commonly used to irradiate a target volume encompassing the tissue to be treated during radiation therapy with a treatment beam. As is known, linear accelerators use microwave or radio frequency technology to accelerate electrons in a waveguide and then allow the electrons to collide with a metal target. As a result of the collisions, high-energy x-rays are scattered from the target. A portion of the scattered x-rays is collected and shaped by a beam collimating device to form an output treatment beam conforming to the shape of the target volume. The linear accelerator also includes a gantry that rotates around the patient allowing the output treatment beam to be delivered to the desired target volume from any angle by rotating the gantry.

Prior to exposing a patient to radiation, a treatment plan is typically developed to determine accurately the location of the tissue to be treated and how best to treat the tissue with radiation. Many imaging techniques have been used in treatment planning such as, computed tomography (CT), magnetic resonance (MR) imaging, and nuclear scintigraphy including single photon emission tomography (SPECT) and positron emission tomography (PET).

In the case of MR imaging, the patient is placed into an MRI machine and subjected to a uniform, main magnetic field $B_0$ produced by a polarizing magnet housed within the MRI machine causing the axes of hydrogen protons in the patient to line up and assume a resting state thereby creating a nuclear magnetization vector oriented along the axis of the MRI machine. Radio frequency (RF) pulses, generated by an RF coil housed within the MRI machine in accordance with a particular localization method, are used to scan target tissue of the patient causing the magnetization vector to deflect. MRI signals are radiated by excited nuclei in the target tissue in the intervals between consecutive RF pulses as a result of the deflected magnetization vector returning to the resting state. The MRI signals are in turn sensed by a receive RF coil or coil array. During MRI signal sensing, gradient coils are used to generate gradient magnetic fields that are switched rapidly to alter the main magnetic field $B_0$ at localized areas thereby allowing spatial localization of MRI signals radiated by selected slices of the target tissue. The sensed MRI signals are in turn digitized and processed to reconstruct images of the target tissue slices using one of many known techniques. The reconstructed images of the tissue are then used to define the target volume so that during radiation therapy, the actual tissue irradiated by the output treatment beam of the linear accelerator conforms as much as possible to the target volume. In many instances, the reconstructed images of the tissue used to define the target volume are acquired in a single scan.

Combined linear accelerator and magnetic resonance imaging systems (Linac-MR) to provide both precise radiation therapy and rapid patient imaging have been considered and a number of Linac-MR systems are currently in various stages of development as Linac-MR allow for tighter margins, dose escalation, and adaptive treatment with fewer side effects. These Linac-MR systems include both perpendicular and parallel Linac-MR. For example, perpendicular Linac-MR have been developed by ViewRay Technologies, Inc. of Denver, Colorado and Elekta Unity of Stockholm, Sweden. These Linac-MR systems employ perpendicular magnetic resonance imaging and linear accelerator components. The magnetic resonance imaging component has cylindrical windings that generate a fixed main magnetic field $B_0$ along the bore axis. The linear accelerator component is mounted on a gantry that rotates around the bore of the magnetic resonance imaging, with the treatment beam generated by the linear accelerator component being along an axis orthogonal to the main magnetic field $B_0$. The perpendicular arrangement of the treatment beam and the main magnetic field $B_0$ leads to perturbations in the dose deposition, which are due to the Lorentz force curving the paths of secondary electrons.

Parallel Linac-MR systems have also been developed by Alberta Health Services of Edmonton, Alberta and the Ingham Institute in Australia. The Alberta Linac-MR and the Australian Linac-MR are parallel systems meaning the treatment beams generated by the linear accelerator components are parallel to the main magnetic fields $B_0$ of the magnetic resonance imaging components. There are however notable differences between these parallel Linac-MR systems. The Australian Linac-MR has a magnetic resonance imaging component that generates a fixed main magnetic field $B_0$ and also has a fixed linear accelerator component. The Alberta Linac-MR on the other hand generates a main magnetic field $B_0$ using magnets mounted on the same gantry as the linear accelerator component and thus, generates a rotating main magnetic field $B_0$. As a result, the Alberta Linac-MR has the ability to treat patients from all gantry angles, including arc treatments, unlike the Australian Linac-MR. At the same time, the Alberta Linac-MR maintains a parallel orientation of the main magnetic field $B_0$ and the linear accelerator treatment beam, which means the dose deposition is not significantly distorted like is seen in perpendicular Linac-MR. The main magnetic field $B_0$ in parallel Linac-MR causes electrons to spiral helically but does not deflect them in a particular direction. One challenge of parallel Linac-MR is that if the main magnetic field $B_0$ is poorly shielded in the head of the linear accelerator component and for a section of the air column, it will trap and contain head scatter and air scatter electrons, leading to an increase in surface dose.

Despite their varied differences, all Linac-MR need to achieve precise treatment delivery and excellent rapid imaging of soft-tissue structures. The latter can only be accomplished with high signal-to-noise (SNR) obtained from specially designed detectors known as receive radio frequency (RF) coils, making the RF coils an essential piece of the instrumentation needed to achieve real-time image-guided radiation therapy.

The interaction between RF coils and treatment beams of Linac-MR has been studied extensively. Traditional RF coil arrays placed in the treatment beam can increase the surface dose several fold, which can lead to unwanted and harmful skin reactions in patients, even if the dose to the target volume is unchanged. Several ways to address this issue have been proposed and tested. In perpendicular Linac-MR, the Lorentz force on electrons generated in the RF coils has been exploited by using spacers to generate an airgap between the RF coil array and the patient. Out-of-beam RF coils, which avoid collisions between the treatment beam and the RF coils altogether, are conceptually a simple solution to avoid the undesired consequences of treatment beam and RF coil interactions and have been explored for both the Australia Linac-MR and the Alberta linac-MR.

As mentioned above, the Alberta Linac-MR has a unique property, namely its rotating main magnetic field $B_0$. In addition to avoiding interactions with the treatment beam, RF coils for the Alberta Linac-MR also need to be designed with consideration of how image quality varies as a function of gantry rotation. The rotation of the main magnetic field $B_0$ means the magnetization's plane of precession will be different at different gantry angles. In the Alberta Linac-MR the main magnetic field $B_0$ rotates in the patient transverse plane. The patient axis is always perpendicular to the main magnetic field $B_0$ and an RF coil array sensitive to this axis will have angle-invariant SNR. The second component of precession, however, rotates in the patient transverse plane along with the main magnetic field $B_0$ though always orthogonal to main magnetic field $B_0$.

As will be appreciated, in parallel Linac-MR that employ rotating main magnetic fields $B_0$, RF coil arrays that can maintain consistent image quality over three-hundred and sixty (360) degrees are desired. It is therefore an object to provide a novel radio frequency (RF) coil array for use in a combined linear accelerator and magnetic resonance imaging system (Linac-MR) and a novel Linac-MR incorporating the same.

This background serves only to set a scene to allow a person skilled in the art to better appreciate the following brief and detailed descriptions. Therefore, none of the above discussion should necessarily be taken as an acknowledgement that this discussion is part of the state of the art or is common general knowledge.

BRIEF DESCRIPTION

It should be appreciated that this brief description is provided to introduce a selection of concepts in a simplified form that are further described below in the detailed description. This brief description is not intended to be used to limit the scope of claimed subject matter.

Accordingly, in one aspect there is provided a radio frequency (RF) coil array for use with a magnetic resonance system having a rotating main magnetic field $B_0$, the RF coil array comprising at least three separate coils, the coils being electrically isolated from one another, concentrically overlaid to form a stack, and configured to sense magnetization precession in three orthogonal planes.

In one or more embodiments, each coil has a primary sensitivity axis, with the primary sensitivity axes being mutually perpendicular. In one form, the coils have geometries configured such that adjacent coils in the stack have substantially zero mutual inductance and the stack comprises three coils.

In one form, the stack comprises three coils. The three coils comprise a single turn coil and a pair of butterfly or figure-eight coils, wherein one of the butterfly or figure-eight coils is rotated ninety (90) degrees with respect to the other of the butterfly or figure-eight coils. Each butterfly coil may comprise a pair of lobes that are mirrored. The lobes may be D-shaped and form a broken circle or polygon. The single turn coil may be polygonal. In a particular form, the single turn coil may be octagonal.

In one form, the single turn coil and butterfly or figure-eight coils each comprise electrically conductive tracing on an insulating substrate surface.

According to another aspect, there is provided a radio frequency (RF) coil array for use with a magnetic resonance system having a rotating main magnetic field $B_0$, the RF coil array comprising three electrically conductive coils, the coils being electrically isolated from one another and arranged coaxially to form a stack, the coils being configured such that adjacent coils in the stack have substantially zero mutual inductance, and sense magnetization precession in three orthogonal planes.

In one or more embodiments, the three coils comprise a single turn coil and a pair of butterfly or figure-eight coils, wherein one of the butterfly or figure-eight coils is rotated ninety (90) degrees with respect to the other of the butterfly or figure-eight coils. In one form, each butterfly coil comprises a pair of lobes that are mirrored. The lobes may be D-shaped and form a broken circle or may be polygonal. The single turn coil may be polygonal. In a particular form, the single turn coil may be octagonal.

In one form, the single turn coil and butterfly or figure-eight coils each comprise electrically conductive tracing on an insulating substrate surface.

According to another aspect, there is provided a combined, parallel linear accelerator and magnetic resonance imaging system (Linac-MR) comprising: a linear accelerator; a magnetic resonance imaging (MRI) apparatus; and a rotatable gantry to which the linear accelerator and MRI apparatus are coupled, the MRI apparatus comprising the radio frequency coil array of any of paragraphs [0013] to [0019].

In one form, the radio frequency coil array is positioned upright within a bore of the MRI apparatus.

According to another aspect, there is provided a radio frequency coil array comprising an array of coil arrangements, each coil arrangement comprising at least three electrically conductive coils, the coils being electrically isolated from one another and arranged coaxially to form a stack, the coils being configured such that adjacent coils in the stack have substantially zero mutual inductance, and sense magnetization precession in three orthogonal planes.

In one form, adjacent coil arrangements are one of (i) non-overlapping and (ii) overlapping.

BRIEF DESCRIPTION OF THE DRAWINGS

Embodiments will now be described by way of example only with reference to the accompany drawings in which:

FIG. 9e shows SNR as a function of depth from coronal slices acquired at a gantry angle of forty-five (45) degrees;

FIG. 9f shows SNR as a function of depth from coronal slices acquired at a gantry angle of ninety (90) degrees;

FIG. 9g shows gantry dependence of the noise correlation coefficients between a single turn coil, a horizontal butterfly coil, and a vertical butterfly coil of the RF coil array of FIG. 4;

DETAILED DESCRIPTION

Figure 1:
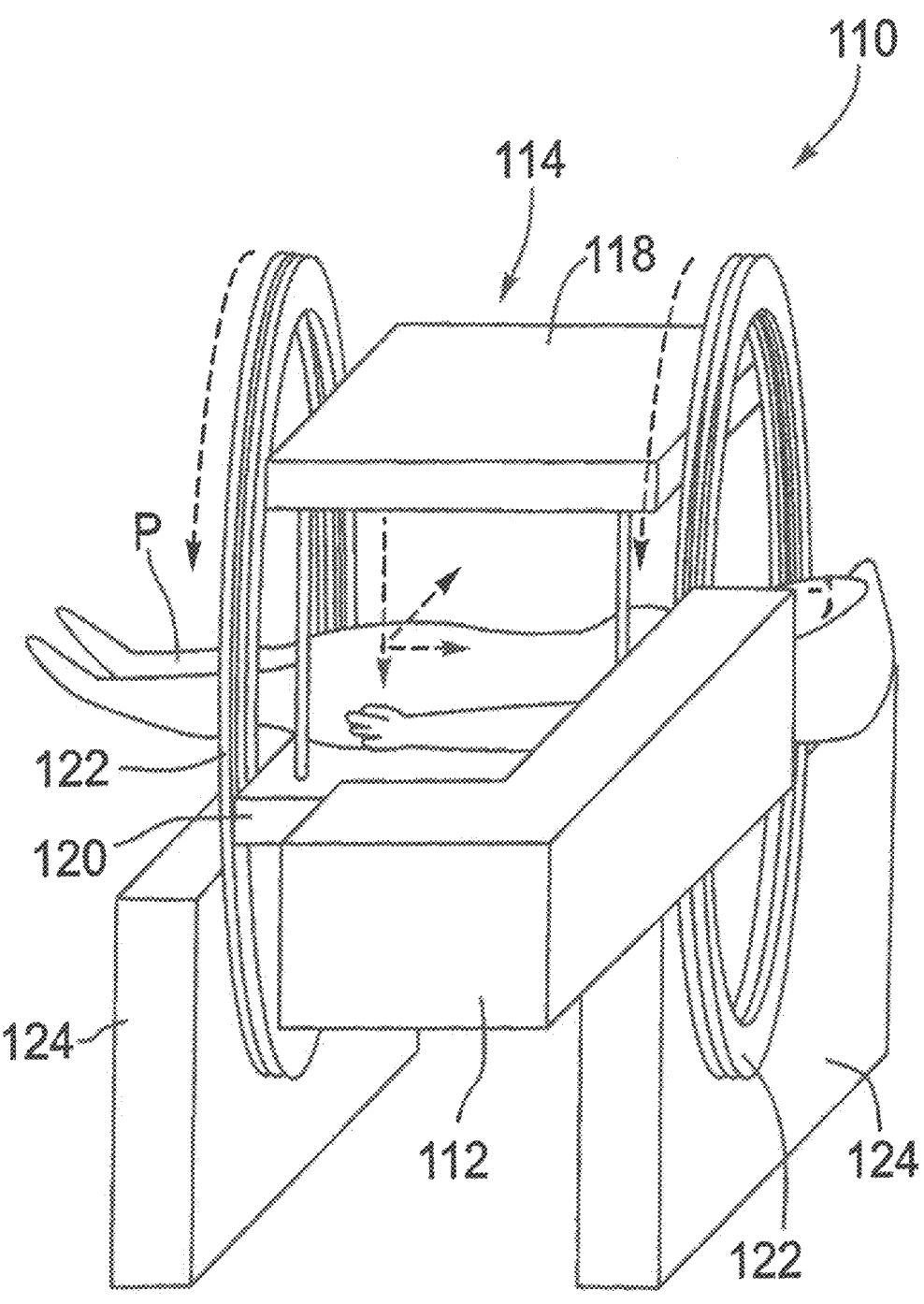
FIG. 1 is an isometric view of a combined linear accelerator and magnetic resonance imaging system (Linac-MR)

The foregoing brief description, as well as the following detailed description of certain examples will be better understood when read in conjunction with the appended drawings. As used herein, an element or feature introduced in the singular and preceded by the word "a" or "an" should be understood as not necessarily excluding the plural of the elements or features. Further, references to "one example" or "one embodiment" are not intended to be interpreted as excluding the existence of additional examples or embodiments that also incorporate the described elements or features. Reference herein to "example" or "embodiment" means that one or more feature, structure, element, component, characteristic and/or operational step described in connection with the example or embodiment is included in at least one implementation of the subject matter according to the subject disclosure. Thus, the phrases "an example", "another example", "an embodiment", "another embodiment" and similar language throughout the subject disclosure may, but do not necessarily, refer to the same example or embodiment. Further, the subject matter characterizing any one example or embodiment may, but does not necessarily, include the subject matter characterizing any other example or embodiment.

Unless explicitly stated to the contrary, examples or embodiments "comprising" or "having" or "including" an element or feature or a plurality of elements or features having a particular property may include additional elements or features not having that property. Also, it will be appreciated that the terms "comprises", "has", "includes" means "including but not limited to" and the terms "comprising", "having" and "including" have equivalent meanings.

As used herein, the term "and/or" can include any and all combinations of one or more of the associated listed elements or features.

Reference herein to "configured" denotes an actual state of configuration that fundamentally ties the element or feature to the physical characteristics of the element or feature preceding the phrase "configured to."

It will be understood that when an element or feature is referred to as being "on", "attached" to, "connected" to, "coupled" to, "contacting", "fixed" to etc. another element or feature, that element or feature can be directly on, attached to, connected to, coupled to, or contacting the other element or feature or intervening elements may also be present. In contrast, when an element or feature is referred to as being "directly" on, "directly attached" to, "directly connected" to, "directly coupled" to, "directly contacting", "directly fixed" to etc. another element or feature, there are no intervening elements or features present. Similarly, it will be understood that when an element is referred to as being "directly between" other elements, that element is positioned between the other elements without any intervening elements. In contrast, when an element is referred to as being "between" other elements, that element is positioned between the other elements but intervening elements may also be present.

It will be understood that spatially relative terms such as "bottom", "under", "below", "lower", "over", "upper", "top", "front", "back", "rear", "side" and the like, may be used herein for ease of describing the relationship of an element or feature to another element or feature as depicted in the figures. The spatially relative terms can however, encompass different orientations in use or operation in addition to the orientation depicted in the figures.

As used herein, the terms "approximately", "about", "generally", "substantially" etc. represent an amount or characteristic close to the stated amount or characteristic that still performs the desired function or achieves the desired result. For example, the terms "approximately" and "about" in reference to a stated amount include amounts that are within engineering or design tolerances of the stated amount that would be readily appreciated by a person skilled in the art. Similarly, for example, the term "substantially" in reference to a stated characteristic of an element includes elements that nearly completely provide the stated characteristic, and the term "generally" in reference to a stated characteristic of an element includes elements that predominately provide the stated characteristic.

In the subject disclosure, a radio frequency (RF) coil array for use with a magnetic resonance system having a rotating main magnetic field $B_0$ is described. The RF coil array comprises at least three separate coils, the coils being electrically isolated from one another, concentrically overlaid to form a stack, and configured to sense magnetization precession in three orthogonal planes. Further specifics of the radio frequency (RF) coil array and its use will now be described.

Figure 2:
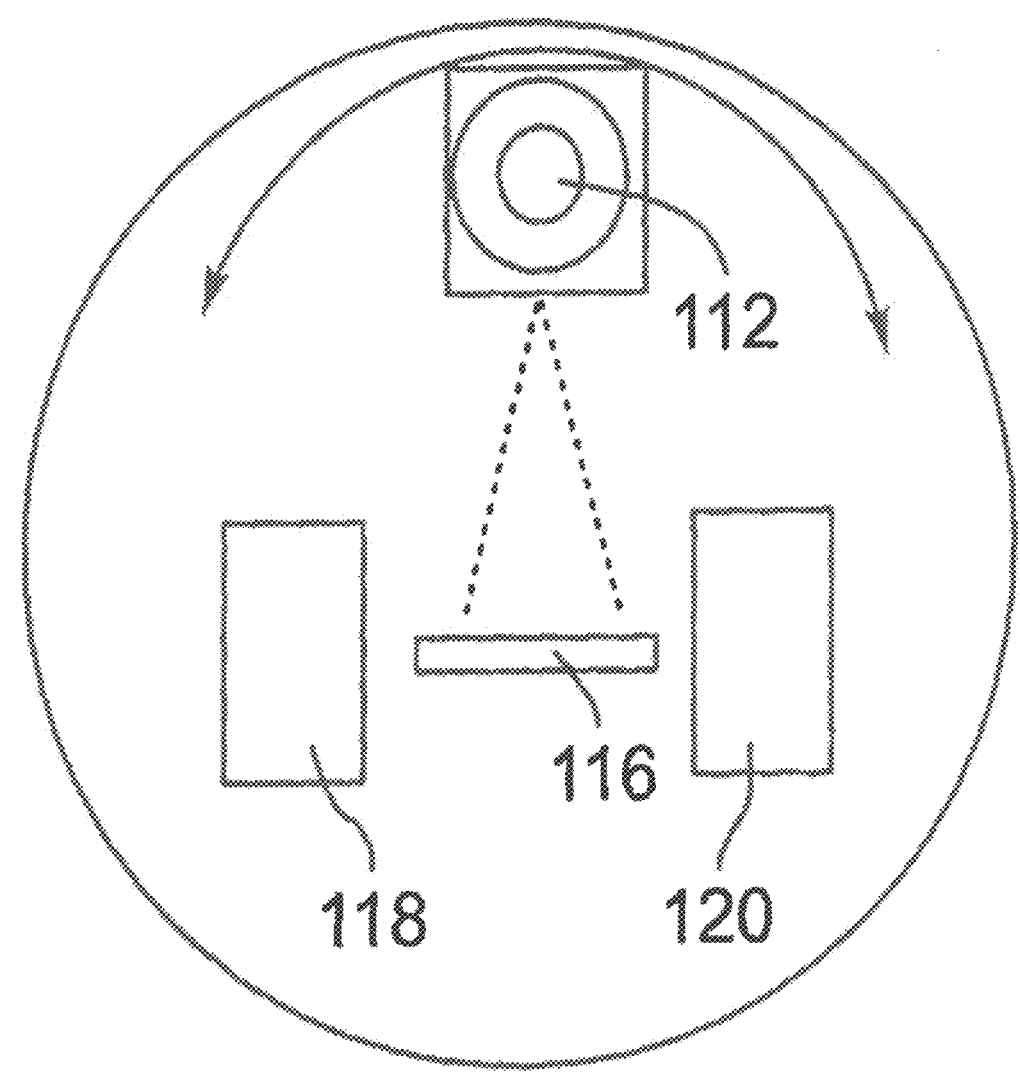
FIG. 2 is a view in a transverse plane of the Linac-MR of FIG. 1.
Figure 3:
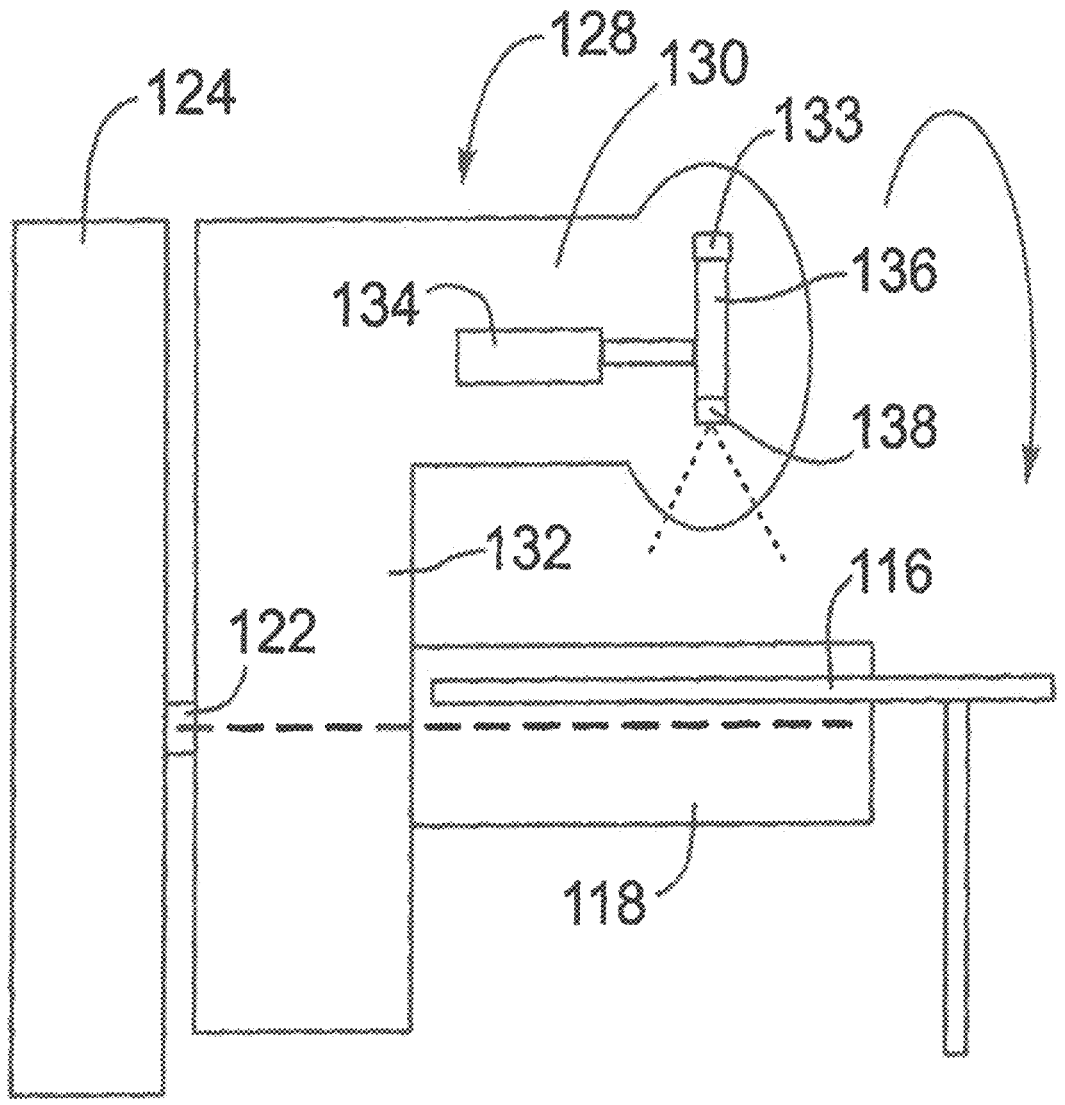
FIG. 3 is a view in a sagittal plane of the Linac-MR of FIG. 1.

Referring now to FIGS. 1 to 3, a combined parallel linear accelerator and magnetic resonance imaging system (Linac-MR) is shown and is generally identified by reference numeral 110. As can be seen, the Linac-MR 110 includes a linear accelerator 112 and a magnetic resonance imaging (MRI) apparatus 114. As will be described, the linear accelerator 112 is configured to generate a treatment beam and the MRI apparatus 114 is configured to image a patient P in real-time. The linear accelerator 112 and the MRI apparatus 114 are coupled to a rotatable gantry 122 that is supported by a frame 124 so that the linear accelerator 112 and MRI apparatus 114 can be rotated in unison to treat the patient P.

In this example, the MRI apparatus 114 comprises a biplanar magnet having a pair of opposing magnet poles 118 and 120 creating a 0.5 T magnetic field strength. The MRI apparatus 114 is an open bore type including a table 116 on which the patient P can lay. As can be seen in FIG. 1, the magnet poles 118 and 120 of the biplanar magnet are disposed above and below the table 116, which is not shown in FIG. 1 for ease of reference, and hence above and below the patient P. The linear accelerator 112 and magnet poles 118 and 120 are mounted on the gantry 122. In FIGS. 2 and 3, the gantry 122 is rotated, and the magnet poles 118 and 120 of the biplanar magnet are disposed on the left-hand side and right-hand side of the table 116, respectively.

The linear accelerator 112 includes a head 128 housing an electron beam generator 130 mounted on an arm 132 that is affixed to the gantry 122. In this manner, the linear accelerator 112 rotates in unison with the gantry 122 and thus, maintains its position relative to the magnet poles 118 and 120. If desired, the linear accelerator 112 may have its own gantry. In this case, the gantry of the linear accelerator 112 and the gantry 122 are mechanically coupled so that the linear accelerator 112 rotates in unison with the magnet poles 118 and 120.

The electron beam generator 130 includes an electron gun 133, a radio frequency (RF) generator 134, an accelerating waveguide 136, a metal target 138 at one end of the accelerating waveguide 136, and a beam collimating device (not shown). Interference reducing structure (also not shown) is also provided to inhibit the linear accelerator 112 and MRI apparatus 114 from interfering with one another during operation.

During radiation therapy the linear accelerator 112 uses the RF generator 134 to accelerate electrons in the accelerating waveguide 136 and then allow the electrons to collide with the metal target 138. As a result of the collisions, high-energy x-rays are scattered from the metal target 138. A portion of the scattered x-rays is collected and shaped by the beam collimating device (not shown) to form an output treatment beam conforming to the shape of the target volume.

The MRI apparatus 114 in addition to the biplanar magnet comprises RF gradient coils, a transmit RF coil, and a receive RF coil array. The biplanar magnet produces the main magnetic field $B_0$ causing the axes of hydrogen protons in the patient P to line up and assume a resting state thereby creating a magnetization vector oriented along the axis of the main magnetic field $B_0$. Radio frequency (RF) pulses, generated by the transmit RF coil are used to scan target tissue of the patient P causing the magnetization vector to deflect. MRI signals are radiated by excited nuclei in the target tissue in the intervals between consecutive RF pulses as a result of the deflected magnetization vector returning to the resting state. The MRI signals are in turn sensed by the receive RF coil array. During MRI signal sensing, the RF gradient coils, which produce a magnetic gradient field distribution that is weaker than the main magnetic field $B_0$, are switched rapidly to alter the main magnetic field $B_0$ at localized areas thereby allowing spatial localization of MRI signals radiated by selected slices of the target tissue. The sensed MRI signals are in turn digitized and processed to reconstruct images of the target tissue slices using one of many known techniques. The reconstructed images of the tissue are then used to define the target volume so that during radiation therapy, the actual tissue irradiated by the output treatment beam of the linear accelerator 112 conforms as much as possible to the target volume.

Figure 4:
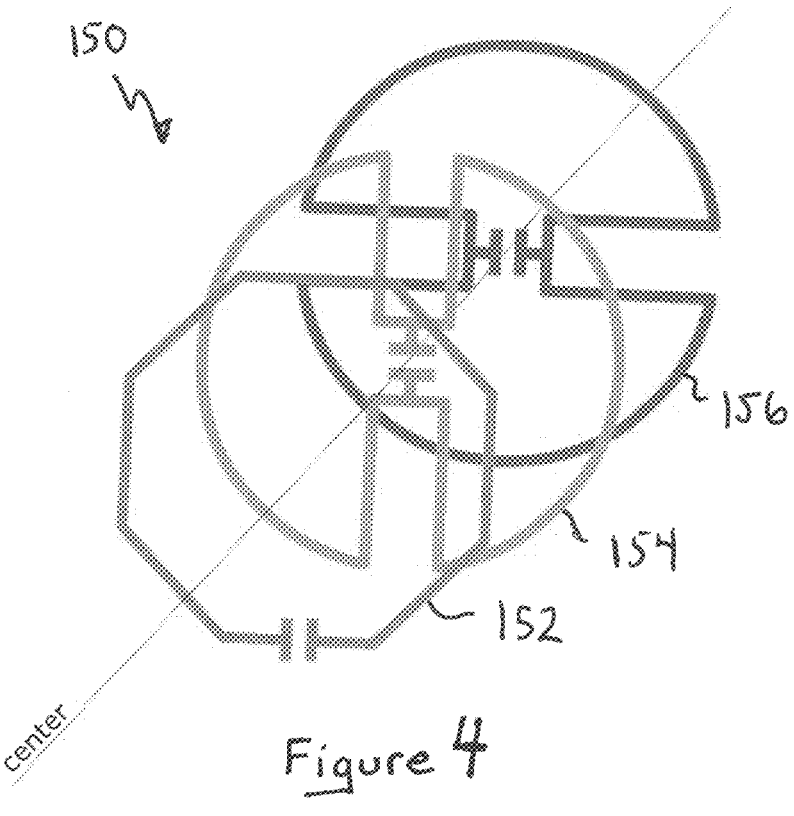
FIG. 4 is an isometric view of a multi-channel, receive, radio frequency (RF) coil array of the Linac-MR of FIG. 1.
Figure 5:
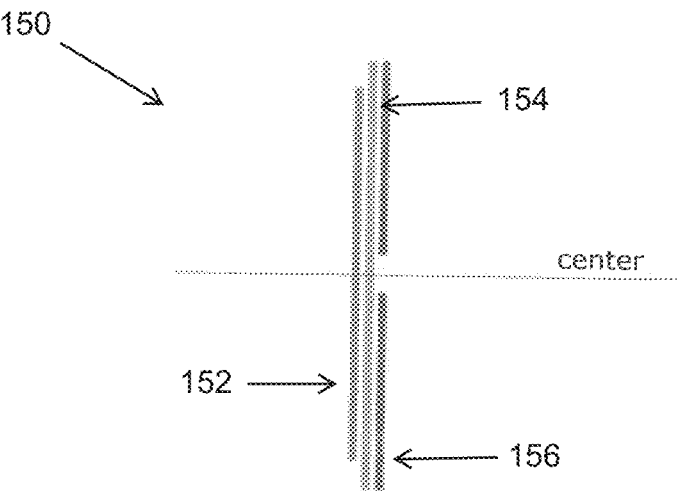
FIG. 5 is a side view of the RF coil array of FIG. 4.

To achieve quadrature-like MRI signal detection independent of gantry angle, the MRI apparatus 114 comprises a three-channel receive, out-of-beam, generally planar RF coil array as shown in FIGS. 4 and 5, which is generally identified by reference character 150. In this embodiment, the RF coil array 150 is particularly suited for imaging the head of the patient P and achieves gantry angle independent imaging while avoiding collisions with the treatment beam generated by the linear accelerator 112. The RF coil array 150 is stationary with respect to the bore of the MRI apparatus 114 and is positioned upright at an out-of-beam location adjacent the head of the patient to be imaged. As can be seen, the RF coil array 150 comprises three separate coils, with the coils being electrically isolated from one another. The coils are concentrically overlaid or coaxially arranged to form a stack and are configured to sense magnetization precession in three orthogonal planes.

In particular, the RF coil array 150 comprises a single turn coil 152 and two (2) butterfly or figure-eight coils 154 and 156 that are all arranged co-axially and are each associated with a respective channel. The single turn coil 152 in this embodiment is polygonal and in particular, octagonal while each butterfly coil has two (2) mirrored D-shaped lobes or wings that form a broken circle. The D-shaped lobes are joined by a generally centrally positioned bridge. Butterfly coil 156 is rotated ninety (90) degrees with respect to butterfly coil 154. Centrally positioned butterfly coil 154 is configured as a vertical butterfly coil and butterfly coil 156 is configured as a horizontal butterfly coil.

Each of the coils in the RF coil array 50 comprises an electrically conductive trace that is applied to, deposited on, or formed with an electrically insulating substrate surface. The conductive traces are thin and formed of copper or other suitable low resistance conductive material to minimize resistance and hence losses. Each of the coils also comprises a capacitor to make the coil resonant at the MR (Larmor) frequency.

In this embodiment, the conductive traces forming butterfly coils 154 and 156 are on opposite surfaces of an electrically insulating substrate such as a printed circuit board (PCB) or the like. The conductive traces of the single turn coil 152 are provided on the surface of another electrically insulating substrate that can be brought into close proximity with the PCB and oriented so that the coils remain electrically isolated. As will be appreciated, by arranging the coils 152 154, and 156 of the RF coil array 150 in a stack, complexity of set up is reduced allowing the RF coil array 150 to be used with immobilization devices or additional coils.

Figures 6, 7:
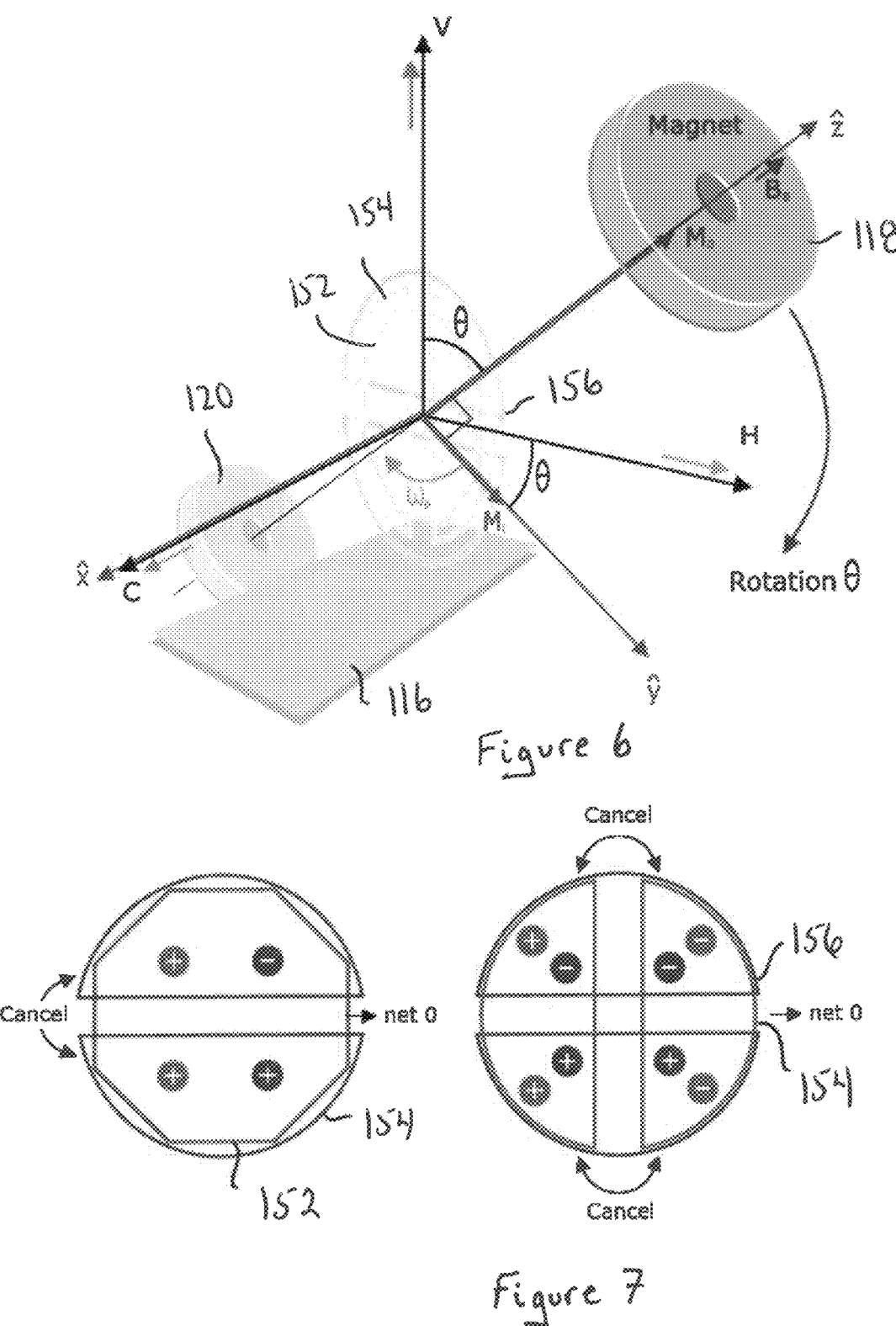
FIG. 6 is a view showing the RF coil array of FIG. 4 relative to a table and magnetic poles of the Linac-MR of FIG. 1.
FIG. 7 is a view showing the geometric decoupling achieved by the symmetry of the coils of the RF coil array of FIG. 4.

The configuration of the coils 152 154, and 156 allows the RF coil array 150 to capture both components of magnetic precession resulting from the deflected magnetization vector returning to its resting state in any plane as the primary sensitivity axes of the three coils 152 154, and 156 are mutually perpendicular as shown in FIG. 6. The single turn coil 152 is sensitive along the axis normal to the plane of the coil (transverse plane). The butterfly coils 154 and 156 are sensitive to an axis in the transverse plane and by rotating one of the butterfly coils 154 and 156 ninety (90) degrees relative to the other, the butterfly coil 156 is sensitive to the axis normal to the sagittal plane and the butterfly coil 154 is sensitive to the axis normal to the coronal plane.

In FIG. 6, the axis (black) defined by the patient P and the RF coil array 150 is marked by the axis labels C, H, and V. When the gantry 122 holding the magnet poles 118 and 120 and the linear accelerator 112 is rotated to some gantry angle θ, the main magnetic field B$_0$ defines the axis (brown) marked by $\hat{x}$, $\hat{y}$, and $\hat{z}$. The magnetization (red), which will precess about $\hat{z}$, can be described by components M$_o$ and M$_i$ oscillating at the Larmor frequency along C, H, and V using simple geometry. Each of the coils in the RF coil array 150 is primarily sensitive to one of the components C, H, and V. By combining the Larmor frequency signal in each of the coils, the magnetization in the xy-plane, M$_i$ is detected in a quadrature like manner. It is detected both when along $\hat{x}$ and $\hat{y}$ regardless of the gantry angle θ.

The geometry of the single loop coil 152 and butterfly coils 154 and 156 is selected to ensure substantially zero mutual inductance between each pair of adjacent coils. As can be seen in FIG. 7, the single turn coil 152 overlaps substantially equally with each of the two D-shaped lobes of the adjacent butterfly coil 154. The D-shaped lobes of each butterfly coil generate equal and opposite magnetic fields and hence there is zero mutual inductance between the D-shaped lobes. The symmetry between of each D-shaped lobe of the butterfly coils 154 and 156 also leads to substantially zero mutual inductance between the adjacent butterfly coils.

In FIG. 7, the plus and minus symbols represent the sign of the coupled signal. In each case, because the geometry is symmetric, each coupling magnitude will be equal. The interaction between coils is dictated by the product of their coupling and the signals in each coil. When there are multiple segments with different products, the effect must be added. On the left, the coupling between the single turn coil 152 and each lobe of the butterfly coil 154 is equal and opposite leading to a net zero coupling. On the right is shown the overlapped butterfly coils 154 and 156. Due to the ninety (90) degree rotation, the opposing phases in each D-shaped lobe led to four (4) equal couplings, two of each effective sign. Once again when summed, the net effect on the signal in each coil due to the other is zero.

In case of the rotating main magnetic field B$_0$, the sufficiency of RF coil array 150 design to effectively eliminate mutual inductance can be described as follows: Let S$_C$ be the signal received by the single turn coil 152 and let $\hat{C}$ be the patient inferior to superior axis. Note that the single turn coil 152 is sensitive primarily to magnetization along the $\hat{C}$ axis. Let S$_H$ be the signal received by a butterfly coil with the plane of symmetry being the patient sagittal plane (horizontal butterfly coil 156) and let $\hat{H}$ be the patient left to right axis. Note that the horizontal butterfly coil 156 is sensitive primarily to magnetization along the $\hat{H}$ axis. Let S$_V$ be the signal received by a butterfly coil with the plane of symmetry being the patient coronal plane (vertical butterfly coil 154), and let V be the patient posterior to anterior axis. Note that the vertical butterfly coil 156 is sensitive primarily to magnetization along the V axis.

Based on the reference frame defined by the orthogonal $\hat{C}$, $\hat{H}$, V, as the gantry 122 rotates, the main magnetic field B$_0$ will rotate in the $\hat{H}$-V plane. Consider the main magnetic field B$_0$ at some angle θ with respect to V. In the typical frame then, where the z-axis is along the main magnetic field B$_0$, the magnetization can be described by:

$$M_x(t) = M_i\cos(\omega_0 t)\ \exp\left(\frac{-t}{T_2}\right) \qquad (6.1)$$

$$M_y(t) = M_i\sin(\omega_0 t)\ \exp\left(\frac{-t}{T_2}\right)$$

$$M_z(t) = M_0 - M_i\ \exp\left(\frac{-t}{T_2}\right)$$

The magnetization can be described in terms of the RF coil array co-ordinate system in terms of theta by:

$$M_C(t) = M_i\cos(\omega_0 t)\ \exp\left(\frac{-t}{T_2}\right) \qquad (6.2)$$

$$M_H(t) = M_i\sin(\omega_0 t)\ \exp\left(\frac{-t}{T_2}\right)\cos(\theta) + \left(M_0 - M_i\exp\left(\frac{-t}{T_2}\right)\right)\sin(\theta)$$

$$M_V(t) = M_i\sin(\omega_0 t)\ \exp\left(\frac{-t}{T_2}\right)\sin(\theta) + \left(M_0 - M_i\exp\left(\frac{-t}{T_2}\right)\right)\cos(\theta)$$

The signal is proportional to the magnetization. The signal is each coil depends on the spatial term. The magnetic fields produced by each of the coils is dominantly along the described primary axes, $\hat{C}$, $\hat{H}$, V. Consider the initial magnetization M$_i$ at point in the sample where all three coils have comparable spatial terms (let S$_p$=1). Ignoring relaxation, by Faraday's law of induction, the signal due to this magnetization then proportional to:

$$S_c(t) = -\omega_0 M_i\cos\left(\omega_0\left(t - \frac{\pi}{2\omega_0}\right)\right) \qquad (6.3)$$

$$S_h(t) = \omega_0 M_i\sin\left(\omega_0\left(t - \frac{\pi}{2\omega_0}\right)\right)\cos(\theta)$$

$$S_v(t) = -\omega_0 M_i\sin\left(\omega_0\left(t - \frac{\pi}{2\omega_0}\right)\right)\sin(\theta)$$

Note that the signal in the single turn coil 152 describes the linear reception of magnetization M$_i$ precessing with frequency ω$_0$. The two butterfly coils 154 and 156 however only have a fraction of linear reception depending on the value of θ. Then combining all three coils in terms of root sum of squares:

$$S_{RSS} = \omega_0 M_i\sqrt{\cos(\omega_0\tau)^2 + \sin(\omega_0\tau)^2\cos(\theta)^2 + \sin(\omega_0\tau)^2\sin(\theta)^2} \qquad (6.4)$$

$$= \omega_0 M_i$$

$$\text{where: } \tau = t - \frac{\pi}{2\omega_0}$$

Comparing the time averaged signal magnitude of the single turn coil [S$_c$] and [S$_{RSS}$], the familiar quadrature reception improvement of $\sqrt{2}$ over a single coil is found.

EXAMPLE

A receive RF coil array was constructed to assess its performance. The two butterfly coils 154 and 156 were printed on opposite sides of a biplanar printed circuit board (PCB) using 70 μm copper traces for minimum resistance. Each butterfly coil had a 15 cm radius. The single turn coil 152 was made using 1.27 cm wide self-adhesive copper tape (Venture Tape Corp. No. 1725, Rockland, MA, USA) adhered to a substrate formed of paperboard. The copper tape was 32 μm thick and each segment of the octagon had an outer length of 8 cm. Four indexing holes were provided at the corners of the PCB and the substrate to allow for precise co-axial positioning of the three coils to form the coil stack. Plastic screws and tape were used to hold the single turn coil 152 and substrate to the PCB.

Tuning elements comprising an inductor and crossed diodes in series together with tuning and matching capacitors were mounted centrally, connecting the D-shaped lobes of the butterfly coils in parallel. Vias connecting the two planes of the PCB allowed all matching elements to be mounted on the same face of the PCB. Additionally, cables could be mounted on the same side. For the single turn coil 152, the tuning and matching capacitors were mounted at one segment of the single turn coil.

The coil stack was mounted vertically and placed next to a phantom. Bench measurements of unloaded quality factor (Q), resonance frequency, return loss, and decoupling were made with a Vector Network Analyzer (VNA) (Rohde & Schwarz ZVL3, Munich, Germany). Matching and tuning were adjusted iteratively cycling through all three channels. Q was measured with an $S_{21}$ measurement between the measured channel and a small sniffer probe. Coupling was also optimized through the addition of copper tape segments to adjust mutual capacitance and/or inductance between the various channels. Copper tape was adhered off-center on exposed soldering pad segments of the butterfly coils 154 and 156. The copper segments provided parasitic current pathways that shift the effective shape of the butterfly coil.

For each pair of coils decoupling was improved as much as possible while retaining at least −20 dB reflection loss and system frequency within the 3 dB resonance peak for each coil. The third coil was then adjusted to achieve the best isolation to the other coils while also retaining −20 dB return loss and system frequency within the 3 dB resonance peak for each coil. Each of the coils was checked and minor adjustments were made if needed. This process was repeated three times for each pair of adjacent coils. For each iteration the maximum coupling was noted. The iteration that yielded the lowest maximum coupling was repeated carefully and deemed appropriate for imaging experiments.

Imaging experiments were conducted on the Linac-MR 110 with the linear accelerator 112 turned off to analyze the gantry dependent imaging properties of the RF coil array 150 as a function of the changing orientation of the main magnetic field $B_0$. The phantom was a cylindrical aqueous phantom (19 cm Ø, 15 cm high, 55 mM NaCl and 5 mM $NiCl_2$; ASG Superconductors, Genova, Italy) positioned coaxially and 2.6 cm away from the RF coil array 150. The phantom was positioned with its long axis along the table 116 and its center located at the isocenter of the Linac-MR 110. The RF coil array 150 was positioned vertically in the bore of the MRI apparatus 114, standing on the table 116, and with the RF coil array 150 being co-axial with the bore and hence the axis of rotation of the gantry 112.

A gradient-echo imaging sequence (field of view=25×25 $cm^2$, 10 cm thick slice, TE=12 ms, TR=330 ms, nominal flip angle=60°) was used to evaluate the performance of the RF coil array 150 at a range of gantry angles (−90° to 90°). The RF coil array 150 and phantom were kept stationary on the table and the gantry was rotated to each gantry angle. Transverse, coronal and sagittal slices were acquired through the center of the phantom in the same planes at each gantry angle. To determine SNR, a noise-only image was also acquired at each gantry angle with identical imaging parameters, but without an excitation pulse.

The isolated performance of each individual channel and the combined image at each gantry angle was evaluated using MATLAB scripts (The Mathworks Inc, Natick, Massachusetts, United States). Individual channel SNR was evaluated as the ratio of the mean signal from the 5 cm×5 cm central region of the phantom and the standard deviation of the noise-only image. A combined SNR image was generated using weighted root sum of squares (wRSS) and the combined SNR was taken as the mean signal from the 10×10 cm central region of the phantom in this wRSS image. For the coronal and sagittal slices, the depth profiles were also generated to evaluate drop-off in sensitivity as a function of distance from the array. The depth profile was obtained by averaging the central 10 cm at each depth across the phantom. The isolation of the coil channels was evaluated by generating noise correlation matrices from the noise-only images and plotting the off-diagonal elements as a function of gantry angle.

In addition to SNR measurements, the flip angle was mapped in the same slices as for the SNR measurements at 0° and 90° gantry rotations using the double angle method (using nominal 45° and 90° flip angles). A volume transmit coil was used for all acquisitions.

The bench measured Q-values and couplings for the RF coil array 150, after iterative adjustment of all three coil channels, are given in the following table:

| Coil | Unloaded Q-Value | Loaded Matched Q-Value | Coupling To Adjacent Coil (dB) |
|---|---|---|---|
| Single Turn Coil | 100 ± 10 | 100 ± 10 | |
| | | | −31 |
| Horizontal Butterfly Coil | 110 ± 10 | 100 ± 10 | |
| | | | −16 |
| Vertical Butterfly Coil | 100 ± 10 | 100 ± 10 | |
| | | | −40 |

The matched Q of all three coils was 100. These matched Q-values are reasonable for the frequency of interest and given the conductive elements used. The coupling between any two coils was at or better than −16 dB. The highest coupling of −16 dB occurred between the two butterfly coils 154 and 156, which share opposite sides of the PCB and thus couple capacitively. This coupling is acceptable for imaging and similar or higher values are found often in the literature.

Figure 8:
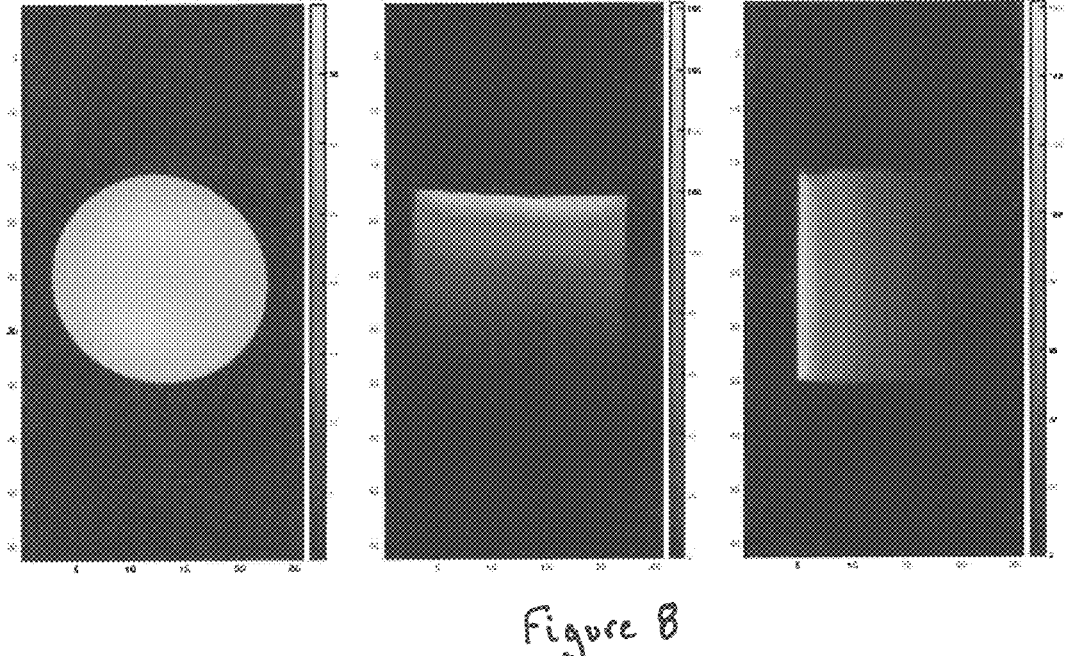
FIG. 8 are combined wRSS SNR images at gantry angles, from left to right, of zero (0) degrees (transverse slice shown), forty-five (45) degrees (coronal slice shown), and ninety (90) degrees (sagittal slice shown)
Figure 9A:
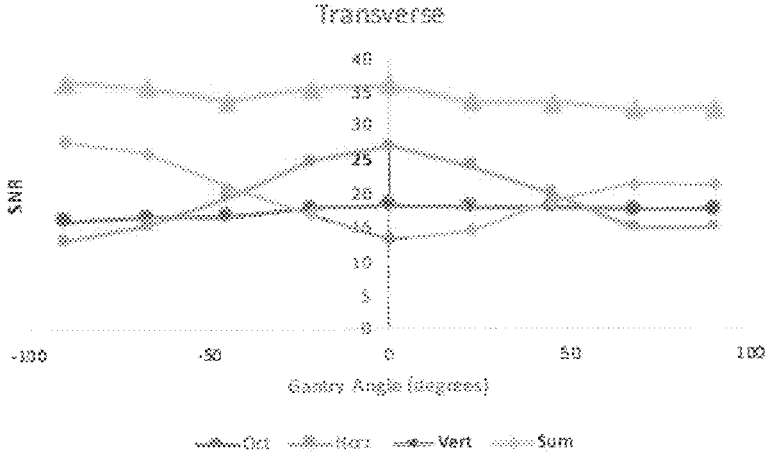
FIG. 9a shows variation in the transverse slice across gantry angles for individual channels of the RF coil array of FIG. 4 and for the wRSS combined image.
Figure 9B:
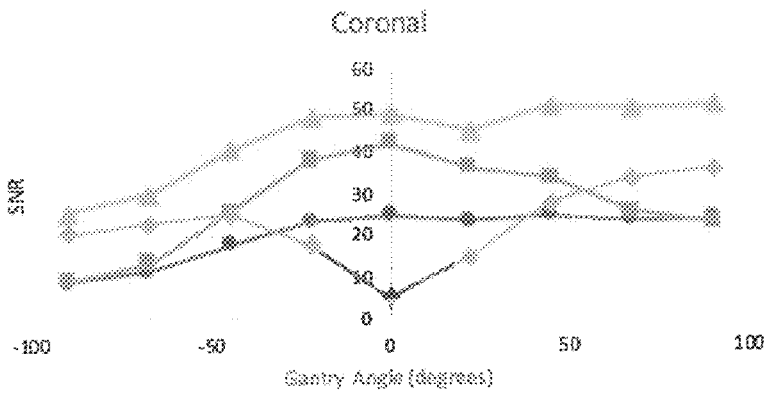
FIG. 9b shows SNR variation in the coronal slice across gantry angles for individual channels of the RF coil array of FIG. 4 and for the wRSS combined image.
Figure 9C:
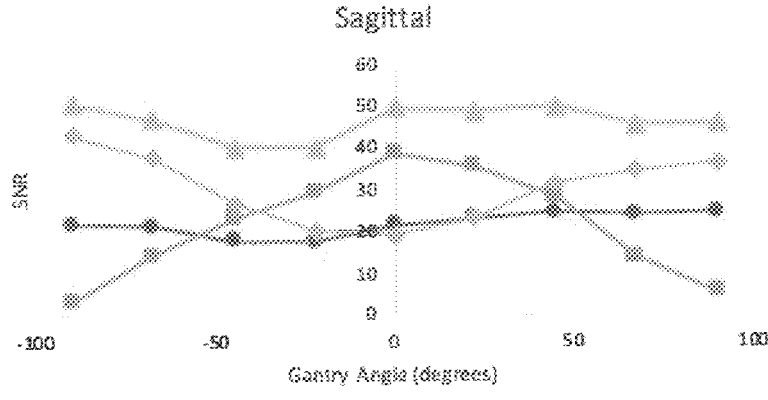
FIG. 9c shows SNR variation in the sagittal slice across gantry angles for individual channels of the RF coil array of FIG. 4 and for the wRSS combined image

Good image quality was achieved with the RF coil array 150 at all gantry angles and for all three slices as shown in FIG. 8. The SNR of the RF coil array averaged 32±4 across all gantry angles as shown in FIGS. 9a to 9c. The performance of the RF coil array 150 is approximately constant across all the gantry angles, with some outliers in the coronal slice images acquired at the −22.5°, −45°, and −90°. The SNR in these images is lower than that in transverse and sagittal images.

The SNR of the individual butterfly coil channels varies with gantry angle as expected based on the changing plane of precession. The horizontal butterfly coil 156 varies as the cosine of the gantry angle and the vertical butterfly coil 154 varies as the sine of the gantry angle, while the single turn coil 152 has approximately constant performance at each gantry angle.

Figure 9D:
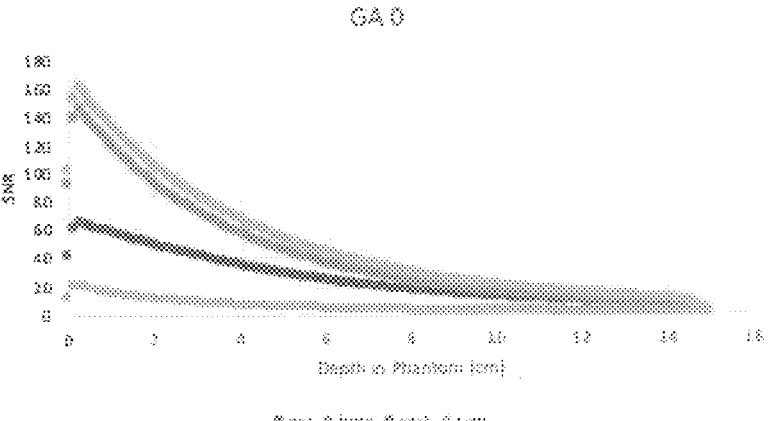
FIG. 9d shows SNR as a function of depth from coronal slices acquired at a gantry angle of zero (0) degrees.

As expected, the SNR fall-off with depth for the butterfly coils 154 and 156 was more rapid than for the single turn coil 152 as shown in FIGS. 9d to 9f. While the butterfly coils 154 and 156 have higher SNR near the coil 152, at the center of the phantom where the transverse slice is acquired, they achieve similar SNR to that achieved by the single turn coil 152. Furthermore, the depth profile looks significantly different for the butterfly coils 154 and 156 at the various gantry angles, as their overall sensitivity changes with the rotation of the precession plane (gantry angle).

Because isolation between the channels was very good, the highest noise correlation value was merely 5% between the single turn coil and horizontal butterfly coil channels at a gantry angle of 22.5° as shown in FIG. 9g.

Figure 10:
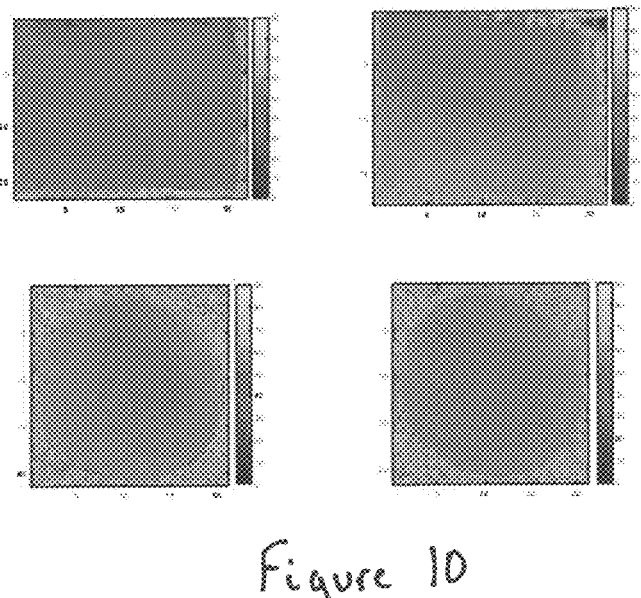
FIG. 10 shows flip angle maps of combined wRSS images.

Acquired flip angle maps (see FIG. 10) show good uniformity is maintained across the extent of the phantom with a reduction in FA occurring right next to the coil, which suggests less than perfect detuning achieved using passive crossed-diode traps. In FIG. 10, the top left flip angle map was acquired at a gantry angle of zero (0) degrees for a sagittal slice, the top right flip angle map was acquired at a gantry angle of minus ninety (−90) degrees for a sagittal slice, the bottom left flip angle map was acquired at a gantry angle of zero (0) degrees for a transverse slice, and the bottom right flip angle map was acquired at a gantry angle of minus ninety (−90) degrees for a transverse slice.

The combined reconstructed images highlight the image quality that was achieved with the RF coil array 150 and the chosen imaging sequence. The phantom extent is easily identified, and the transverse slices were very uniform, which is as expected for a uniform phantom imaged with this array. In the coronal and sagittal slices, the expected fall off of the signal way from the planar receive RF coil array is evident.

The image quality requirement for the receive RF coil array 150 is its stability with gantry angle. This is demonstrated in the plots of SNR against gantry angle as shown in FIGS. 9a to 9c. Most clearly this is seen in the transverse slice where the SNR varies by less than 10% across all gantry angles. This kind of variation (<10%) will not be visually noticeable and hence the combined SNR is deemed constant across all gantry angles (−90° to 90°). While measurements were only done for a 180° rotation, due to the symmetry of the RF coil array 150 and the symmetry seen in the measurements, very similar results are expected over 360°. This constant image quality comes from the combination of a constant baseline provided by the octagonal single turn coil channel, and the two butterfly coil channels that vary sinusoidally, but 90° out of phase with respect to each other. This result suggests the RF coil array 150 is an excellent option for imaging during typical treatments that involve radiation delivery from multiple gantry angles.

The horizontal butterfly coil channel has a maximum at a gantry angle of 0° and follows a cosine curve to minima at −90° and 90°. Conversely the vertical butterfly coil channel has a minimum at 0° and reaches maxima at −90° and 90°. In the center of the phantom where the transverse slice was acquired, at 45° the three channels all have very similar SNRs. This is possible because the butterfly coil channels have higher peak SNR than the single turn coil channel. In this arrangement the single turn coil channel acts as a baseline boost to the butterfly coil channels and helps ensure SNR of the RF coil array 150 does not fall too rapidly with depth in phantom. The complementary SNR profile of the butterfly coil channels and single turn coil channel is further emphasized by the depth profiles at each gantry angle as shown in FIGS. 9d to 9f. The butterfly coils are characterized by faster fall-offs with depth than the octagonal single turn coil and their higher peak performance. This is in line with the expectations for two different styles of coil.

The isolation between all the coils of the RF coil array 150 was excellent both in terms of the bench measured transmission loss between channels shown in the table but also based on the cross-correlation of the noise images. With a peak correlation of about 5% each of the channels contributed unique information and SNR was not degraded by the presence of the other coils.

The flip angle maps of FIG. 10 show that the phantom was excited fairly uniformly. Some distortion is evident near the coil, highlighting that the passive decoupling via crossed-diodes could be improved upon, but over the majority of the phantom volume, and hence the target area where high-SNR imaging would be needed during treatment, the flip angle was sufficiently uniform.

As mentioned above, the orthogonal arrangement of the RF coil array provides the desired sensitivity to magnetization precessing in any plane and allows the three channels to be decoupled geometrically.

In the above embodiment, although the single turn coil 152 is octagonal and the butterfly coils 154 and 156 comprise D-shaped lobes, those of skill in the art will appreciate that the coils of the RF coil array may have alternative shapes while achieving zero mutual inductance. For example, the lobes of the butterfly coils may be polygonal.

Figure 11:
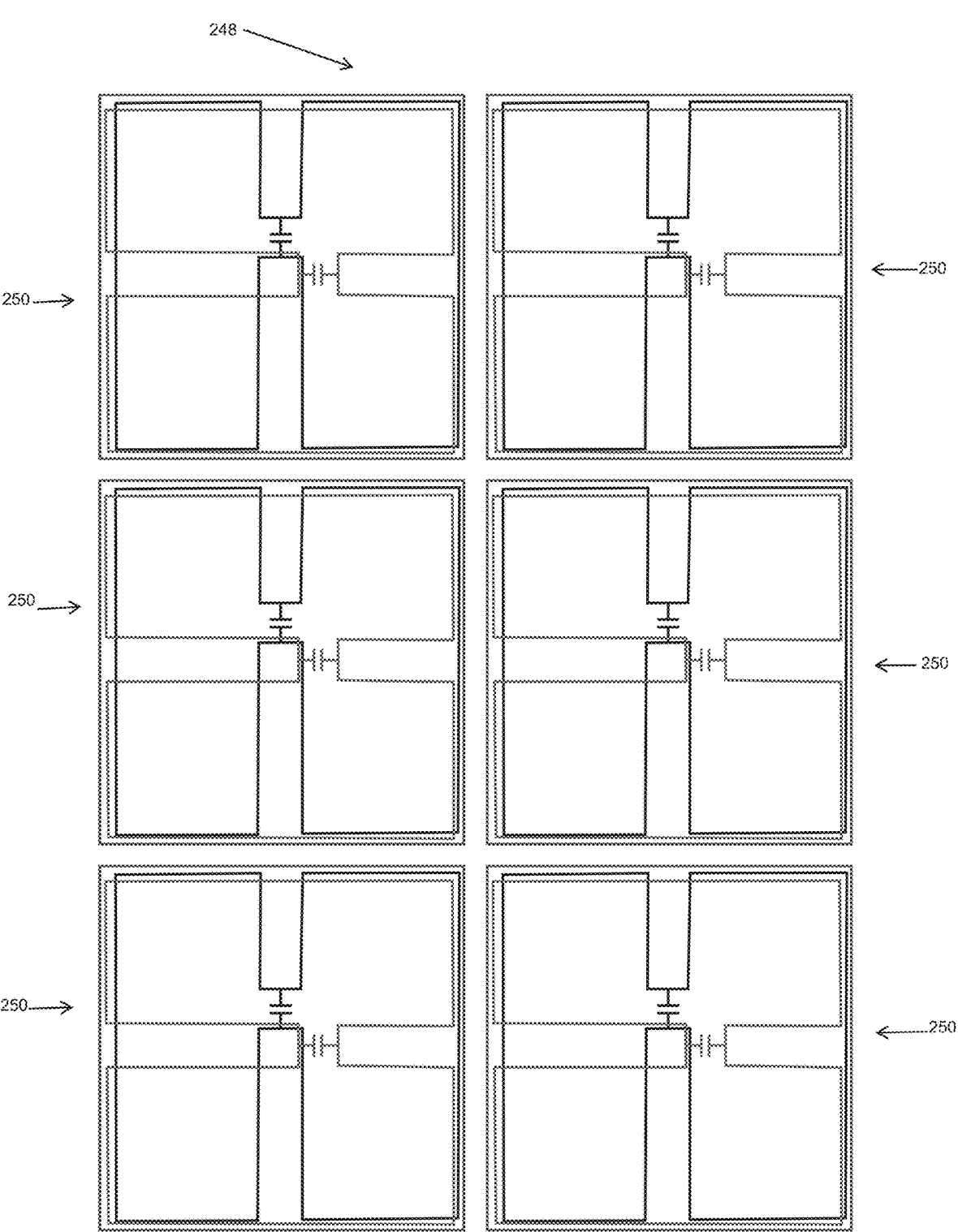
FIG. 11 shows an alternative RF coil array for use in the Linac-MR of FIG. 1 or with conventional MRI scanners.

Turning now to FIG. 11, an alternative RF coil array is shown and is generally identified by reference numeral 248. In this embodiment, rather the having a single, three (3) coil arrangement, the RF coil array 248 comprises multiple three-channel coil arrangements 250 that can be used in the Linac-MR 110, other types of Linac-MR, and in conventional MRI scanners. In this example, the coil arrangements 250 form a 3×2 rectangular array. Those of skill in the art will appreciate that arrays comprising arrangements of larger or smaller coils, as well as different numbers of coils and planar arrangements (e.g., on a hexagonal grid) are of course possible. Also, although the coil arrangements 250 in the RF coil array 248 are shown as being non-overlapping, those of skill in the art will appreciate that adjacent coil arrangements may be overlapped to reduce mutual inductance.

In FIG. 11, although the coils of the coil arrangements are shown as rectangles, with the bridges of the butterfly coils being offset, this is simply for ease of illustration. The coils of each coil arrangement 250 are similar to those of RF coil array 150 and comprise a polygonal single turn coil and two butterfly coils with D-shaped or polygonal lobes.

By virtue of the distributed nature of the coil arrangements 250 of the RF coil array 248, in use the RF coil array can be used to cover or surround a region of the patient to be imaged.

The RF coil arrays may be manufactured inexpensively and reliably using printed circuit board manufacturing techniques. For example, the RF coil array 150 may be designed using KiCAD, Eagle or other suitable design program and design files may be in Gerber and Excellon formats.

Alternatively, the RF coil arrays may be manufactured by additive manufacturing. A common example of additive manufacturing is three-dimensional (3D) printing; however, other methods of additive manufacturing are available. Rapid prototyping or rapid manufacturing are also terms which may be used to describe additive manufacturing processes.

Suitable additive manufacturing techniques include, for example, Fused Deposition Modeling (FDM), Selective Laser Sintering (SLS), 3D printing such as by Stereolithography (SLA), Direct Selective Laser Sintering (DSLS), Electron Beam Sintering (EBS), Electron Beam Melting (EBM), Laser Engineered Net Shaping (LENS), Electron Beam Additive Manufacturing (EBAM), Laser Net Shape Manufacturing (LNSM), Direct Metal Deposition (DMD), Digital Light Processing (DLP), Continuous Digital Light Processing (CDLP), Direct Selective Laser Melting (DSLM), Selective Laser Melting (SLM), Direct Metal Laser Melting (DMLM), Direct Metal Laser Sintering (DMLS), Material Jetting (MJ), NanoParticle Jetting (NPJ), Drop On Demand (DOD), Binder Jetting (BJ), Multi Jet Fusion (MJF), Laminated Object Manufacturing (LOM) and other known processes.

Additive manufacturing processes typically fabricate components or assemblies based on 3D information, for example a three-dimensional computer model (or design file), of the components or assemblies. Design files can take any now known or later developed file format. For example, design files may be in the Stereolithography or "Standard Tessellation Language" (.stl) format, which was created for stereolithography CAD programs of 3D Systems, or the Additive Manufacturing File (.amf) format, which is an American Society of Mechanical Engineers (ASME) standard and which is an extensible markup-language (XML) based format designed to allow any CAD software to describe the shape and composition of any three-dimensional object to be fabricated on any additive manufacturing printer.

Further examples of design file formats include AutoCAD (.dwg) files, Blender (.blend) files, Parasolid (.x_t) files, 3D Manufacturing Format (.3mf) files, Autodesk (3ds) files, Collada (.dae) files and Wavefront (.obj) files, although many other file formats exist.

Design files can be produced using modelling (e.g., CAD modelling) software and/or through scanning the surface of a component or assembly to measure the surface configuration of the product.

Once obtained, a design file may be converted into a set of computer executable instructions that, once executed by a processor, cause the processor to control an additive manufacturing apparatus to produce the component or assembly according to the geometrical arrangement specified in the design file. The conversion may convert the design file into slices or layers that are to be formed sequentially by the additive manufacturing apparatus. The instructions (otherwise known as geometric code or "G-code") may be calibrated to the specific additive manufacturing apparatus and may specify the precise location and amount of material that is to be formed at each stage in the manufacturing process. As discussed above, the formation may be through deposition, through sintering, or through any other form of additive manufacturing method.

The code or instructions may be translated between different formats, converted into a set of data signals and transmitted, received as a set of data signals and converted to code, stored, etc., as necessary. The instructions may be an input to the additive manufacturing system and may come from a part designer, an intellectual property (IP) provider, a design company, the operator, or owner of the additive manufacturing system, or from other sources. An additive manufacturing system may execute the instructions to fabricate the component or assembly using any of the technologies or methods disclosed herein.

Design files or computer executable instructions may be stored in a non-transitory computer readable storage medium (e.g., memory, storage system, etc.) storing code, or computer readable instructions, representative of the component or assembly to be produced. As noted, the code or computer readable instructions defining the component or assembly can be used to physically generate the component or assembly, upon execution of the code or instructions by an additive manufacturing system. For example, the instructions may include a precisely defined 3D model of the component or assembly and can be generated from any of a large variety of well-known computer aided design (CAD) software systems such as AutoCAD®, TurboCAD®, DesignCAD 3D Max, etc. Alternatively, a model or prototype of the component may be scanned to determine the three-dimensional information of the component.

Accordingly, by controlling an additive manufacturing apparatus according to the computer executable instructions, the additive manufacturing apparatus can be instructed to print out one or more components of the RF coil arrays. These can be printed either in assembled or unassembled form.

In light of the above, embodiments include methods of manufacture of the RF coil arrays via additive manufacturing. This includes the steps of obtaining a design file representing the RF coil arrays and instructing an additive manufacturing apparatus to manufacture the RF coil arrays in assembled or unassembled form according to the design file. The additive manufacturing apparatus may include a processor that is configured to automatically convert the design file into computer executable instructions for controlling the manufacture of the RF coil arrays. In these embodiments, the design file itself can automatically cause the production of the RF coil arrays once input into the additive manufacturing device. Accordingly, in this embodiment, the design file itself may be considered computer executable instructions that cause the additive manufacturing apparatus to manufacture the RF coil arrays. Alternatively, the design file may be converted into instructions by an external computing system, with the resulting computer executable instructions being provided to the additive manufacturing device. The instructions are suitable for execution of the processor and for storage on the non-transitory computer readable storage medium. The non-transitory computer-readable medium may comprise any suitable memory or storage device such as random-access memory (RAM), static RAM (SRAM), dynamic RAM (DRAM), non-volatile RAM (NVRAM), read-only memory (ROM), or Flash memory.

Although embodiments have been described above with reference to the accompanying drawings, those of skill in the art will appreciate that other variations modifications may be made.

What is claimed is:

1. A radio frequency (RF) coil array for use with a magnetic resonance system having a rotating main magnetic field $B_0$, the RF coil array comprising at least three separate coils, the coils being electrically isolated from one another, concentrically overlaid to form a stack, and configured to sense magnetization precession in three orthogonal planes.

2. The radio frequency coil array of claim 1, wherein each coil has a primary sensitivity axis with the primary sensitivity axes being mutually perpendicular.

3. The radio frequency coil array of claim 2, wherein the coils have geometries configured such that adjacent coils in the stack have substantially zero mutual inductance.

4. The radio frequency coil array of claim 3, wherein the RF coil array comprises three coils.

5. The radio frequency coil array of claim 4, wherein the three coils comprise a single turn coil and a pair of butterfly or figure-eight coils, and wherein one of the butterfly or figure-eight coils is rotated ninety (90) degrees with respect to the other of the butterfly or figure-eight coils.

6. The radio frequency coil array of claim 5, wherein each butterfly coil comprises a pair of lobes that are mirrored.

7. The radio frequency coil array of claim 5, wherein the single turn coil is polygonal.

8. The radio frequency coil array of claim 5, wherein the single turn coil and butterfly or figure-eight coils each comprise electrically conductive tracing on an insulating substrate surface.

9. A combined, parallel linear accelerator and magnetic resonance imaging system (Linac-MR) comprising:

a linear accelerator;

a magnetic resonance imaging (MRI) apparatus; and a rotatable gantry to which the linear accelerator and MRI apparatus are coupled, the MRI apparatus comprising the radio frequency coil array of claim 1.

10. The Linac-MR of claim 9, wherein the radio frequency coil array is positioned upright within a bore of the MRI apparatus.

11. The Linac-MR of claim 10, wherein the radio frequency coil array is positioned within the bore of the MRI apparatus adjacent a patient's head.

12. A radio frequency (RF) coil array for use with a magnetic resonance system having a rotating main magnetic field $B_0$, the RF coil array comprising three electrically conductive coils, the coils being electrically isolated from one another and arranged coaxially to form a stack, the coils being configured such that adjacent coils in the stack have substantially zero mutual inductance, and sense magnetization precession in three orthogonal planes.

13. The radio frequency coil array of claim 12, wherein the three coils comprise a single turn coil and a pair of butterfly or figure-eight coils, and wherein one of the butterfly or figure-eight coils is rotated ninety (90) degrees with respect to the other of the butterfly or figure-eight coils.

14. The radio frequency coil array of claim 13, wherein each butterfly coil comprises a pair of lobes that are mirrored.

15. The radio frequency coil array of claim 13, wherein the single turn coil is polygonal.

16. The radio frequency coil array of claim 13, wherein the single turn coil and butterfly or figure-eight coils each comprise electrically conductive tracing on an insulating substrate surface.

17. A radio frequency coil array comprising an array of coil arrangements, each coil arrangement comprising at least three electrically conductive coils, the coils being electrically isolated from one another and arranged coaxially to form a stack, the coils being configured such that adjacent coils in the stack have substantially zero mutual inductance, and sense magnetization precession in three orthogonal planes.

18. The radio frequency coil array of claim 17, wherein adjacent coil arrangements are one of (i) non-overlapping and (ii) overlapping.

19. The radio frequency coil array of claim 17, wherein the at least three coils comprise a single turn coil and a pair of butterfly or figure-eight coils, and wherein one of the butterfly or figure-eight coils is rotated ninety (90) degrees with respect to the other of the butterfly or figure-eight coils.

20. The radio frequency coil array of claim 19, wherein each butterfly coil comprises a pair of lobes that are mirrored and wherein the single turn coil is polygonal.

* * * * *